United States Patent [19]

Beneking

[11] Patent Number: 4,641,921
[45] Date of Patent: Feb. 10, 1987

[54] OPTICAL ADJUSTING PROCESS

[75] Inventor: Heinz Beneking, Aachen, Fed. Rep. of Germany

[73] Assignee: Telefunken electronic GmbH, Heilbronn, Fed. Rep. of Germany

[21] Appl. No.: 715,022

[22] Filed: Mar. 22, 1985

[30] Foreign Application Priority Data

Apr. 10, 1984 [DE] Fed. Rep. of Germany ....... 3413374

[51] Int. Cl.$^4$ .............................................. G02B 27/00
[52] U.S. Cl. .................................... 350/320; 350/437; 378/34
[58] Field of Search ........ 350/320, 144, 431, 437–439; 378/321, 34, 35; 350/437, 320

[56] References Cited

U.S. PATENT DOCUMENTS

| | | | |
|---|---|---|---|
| 2,244,687 | 6/1941 | Goldsmith et al. | 350/144 |
| 3,035,488 | 5/1962 | Alden | 350/439 |
| 3,588,227 | 6/1971 | Yamamoto et al. | 350/437 |
| 3,892,973 | 7/1975 | Coglin et al. | 378/34 |
| 4,453,262 | 6/1984 | Buckley | 378/34 |

FOREIGN PATENT DOCUMENTS 1919991 5/1973 Fed. Rep. of Germany .

OTHER PUBLICATIONS

Applied Optics, vol. 16, No. 3, Mar. 1977, pp. 549–550.
Applied Optics, vol. 12, No. 10, Oct. 1973, pp. 2509–2519.

Primary Examiner—John K. Corbin
Assistant Examiner—Loha Ben
Attorney, Agent, or Firm—Spencer & Frank

[57] ABSTRACT

The invention relates to an optical adjusting process for proximity printing wherein a mask is spaced at a short distance from a substrate on which an image of the mask structure is to be formed. According to the invention, a high-definition image of the structures of the mask and of the substrate is formed by means of light of differing wavelength in a common image plane. This adjusting process is intended, in particular, for X-ray lithography.

4 Claims, 2 Drawing Figures $\lambda_1 > \lambda_2$

OPTICAL ADJUSTING PROCESS

BACKGROUND OF THE INVENTION

The invention relates to an optical adjusting process in proximity printing wherein a mask is spaced at a short distance from a substrate on which an image of the mask structure is to be formed.

In semiconductor technology, the structures in a mask are transferred onto a substrate which may, for example, be covered by a light- or radiation-sensitive photoelectric layer which is partially exposed via the mask image. Prior to the exposure step and the subsequent development process, the structures on the mask must be precisely adjusted to the substrate surface and to the structures on the surface of the substrate, respectively. The finer the structures to be produced are, the more precisely the adjustment has to be effected. As adjustment aids, both the mask structure and the substructure on the substrate are generally provided with adjustment marks which are made to coincide in the adjusting process.

Two processes are commonly employed for adjustment. The first is the so-called contact print process wherein the mask is directly placed onto the surface of the substrate. In this case, the structures of the mask and of the substrate surface are essentially located in one plane, so that an image formation of simultaneously high definition of adjustment marks in the mask and adjustment marks on the substrate surface in a common image plane via an optical system is unproblematic. In another known process, the so-called projection masking, the mask and the substrate are not made to register, but are located in different receiving means separated from one another. An image of the structures in the mask is then formed on the surface of the substrate by means of an elaborate optical system.

The so-called proximity printing is a variant of the contact print process. In this case, an extremely close distance between the surface of the substrate and the mask arranged above it is maintained so as to prevent manual damage to the mask and the structures in the substrate surface. With this process, it is possible to substantially increase the service life of the masks put into operation. The component yield may also be substantially improved on account of the avoidance of mechanical damage. The distance between the mask and the substrate surface is, for example, 20 to 100 μm. The depth of definition of the objective employed for imaging of the mask structures and the structures of the substrate surface in a common image plane should then be chosen such that an image of the structures of both object planes used is formed with as high a definition as possible in the image plane. This requirement can, however, no longer be maintained if an image of very fine structures is to be formed, and a high magnification of the adjustment marks in the common image plane is necessary.

SUMMARY OF THE INVENTION

The object underlying the invention is therefore to indicate an optical adjusting process for proximity printing wherein a high-definition image also of very fine structures requiring strong magnification is formed in one image plane, thus ensuring unproblematic adjustment of both object planes to one another. This object is achieved in accordance with the invention by a high-definition image of the structures of the mask and of the substrate being formed by light of differing wavelength in a common image plane.

In a preferred embodiment, an objective is used for the imaging which is so optimally corrected for the two light wavelengths used that a high-definition image of the mask structure is formed by the one light wavelength, and of the substrate structure by the other light wavelength, in one common image plane. The focal distance of such an objective for the two light wavelengths employed therefore corresponds to the proximity distance between the mask and the substrate surface. The proximity distance lies in the range of 20 to 100 μm. The optical adjusting process may be used particularly when the structures are transferred by X-ray lithography from the mask to the substrate surface since this exposure system is intended, in particular, for the range of extremely fine structures in the sum-μm range. The light of differing wavelength provided for the adjustment is chosen such that photoresists which might be on the substrate cannot be exposed. Exposure of the photoresists is then effected in X-ray lithography via the X-rays.

In another suitable embodiment of the optical adjusting process, a high-definition image of the mask structure and of the substrate structure is formed via separate ray paths with a light wavelength determined by filters via a separate optical system assigned to each ray path in an image plane common to both ray paths. This process does, however, generally necessitate three different optical systems since the separate ray paths must be brought together via an additional optical system in the image plane.

BRIEF DESCRIPTION OF THE DRAWINGS

The invention will now be explained in greater detail with reference to an exemplary embodiment.

FIG. 1 shows the unproblematic adjusting process with the pure contact print, whereas

DESCRIPTION OF THE PREFERRED EMBODIMENT OF THE INVENTION

Figure 1:
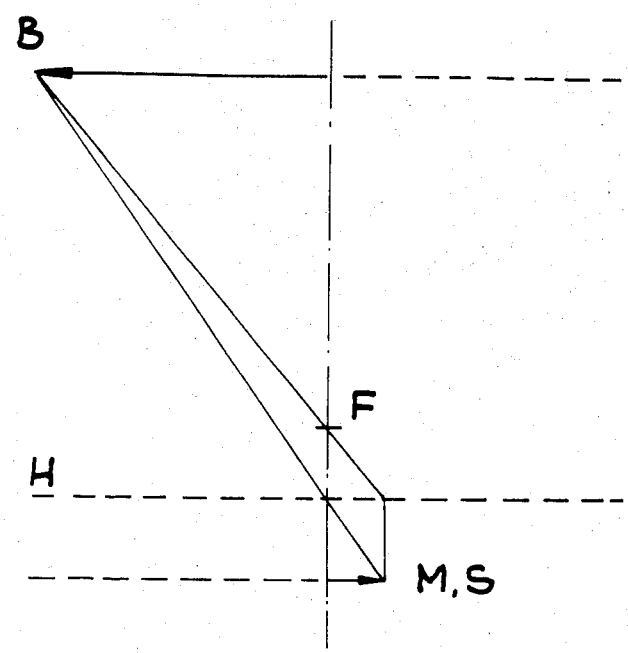

From the illustration in principle in FIG. 1 it is apparent that the mask plane M converges with the substrate plane S in the case of the direct contact print. H designates the main plane of the objective which has a focal point F. The structures of the mask and the substrate located in one plane are transferred into the image plane B via the objective in a sharply defined manner.

Figure 2:
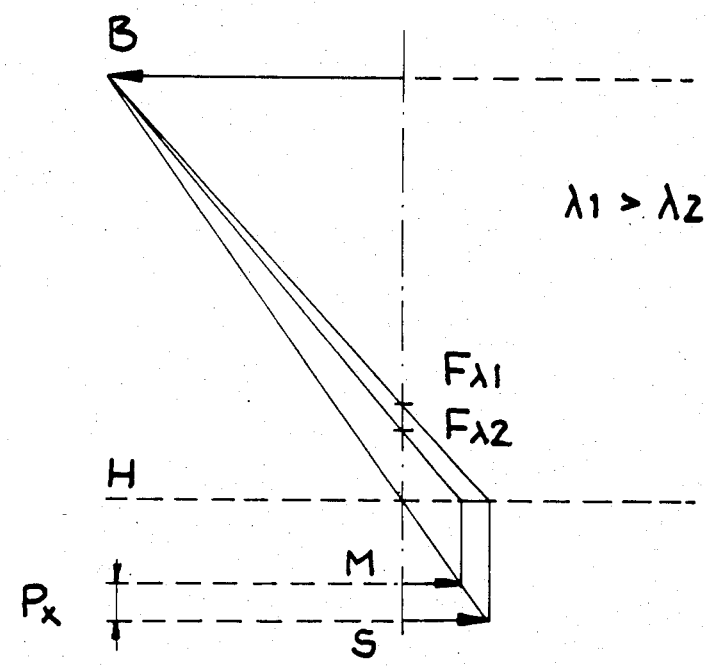
FIG. 2 represents the principal set-up of the inventive adjusting process in proximity printing.

According to the illustration in FIG. 2, the mask level M is arranged at a short distance above the substrate surface S. This distance which is referred to as proximity distance $P_x$ amounts to approximately 20 to 100 μm. The main plane of the objective is again designated by H, and the image plane by B. An objective is used which is optimally corrected in a manner known per se in such a way on two wavelengths $\lambda_1$ and $\lambda_2$ that the objective has a different focal distance for both wavelengths and thus also different focal points $F\lambda_1$ and $F\lambda_2$. Image formation of the substrate surface further removed from the image plane is effected by the wavelength $\lambda_1$, while an image of the mask structure is formed by the wavelength $\lambda_2$. In this case, for example, $\lambda_1 > \lambda_2$ applies to the wavelengths. As is apparent from the illustration in principle in FIG. 2, the focal distance of the objective with respect to the two light wavelengths used is chosen such that the structure of the mask coincides with the associated structure in the substrate in one image point in the image plane B.

If photoresists are used, the wavelengths $\lambda_1$ and $\lambda_2$ employed for the optical adjusting process must be chosen such that these wavelengths do not cause an exposure in the photoresist. It is, for example, possible to employ a light wavelength in the visible yellow range and a light wavelength in the visible red range for the optical adjusting process.

The actual transference of the mask structure into the plane of the substrate surface which is, for example, coated with a photoresist which is sensitive to light or radiation, is carried out by X-ray lithography. This technique has the advantage that practically parallel rays are available, so that the mask structures are transferred into the plane of the substrate surface by means of parallel projection. Aside from an X-ray tube, a so-called synchrotron beam tube may also be used to generate the rays, which permits a relatively large proximity distance and is suited for structuring in the sub-$\mu$m range.

The optical adjusting process according to the invention ensures even in the case of X-ray lithography or exposure via other invisible radiation or invisible light, a sharp adjustment of the adjustment marks in both planes in proximity printing.

What is claimed is:

1. An optical adjusting process for positioning a mask structure relative to a semiconductor substrate for performance of proximity printing, the mask structure being disposed in a first plane and the substrate being disposed in a second plane spaced from the first plane by a small distance having the value required by proximity printing, said process comprising: positioning an objective lens which is optimally corrected for two selected light wavelengths for forming, in a common image plane, a high-definition image of the first plane by light having one of the selected wavelengths and a high-definition image of the second plane by light having the other one of the selected wavelengths; and applying light having the first one of the selected wavelengths to at least the mask structure and light having the second one of the selected wavelengths to at least the substrate.

2. A process as defined in claim 1 wherein the small distance between the two planes is approximately 20–100$\mu$.

3. A process as defined in claim 2 wherein the proximity printing to be performed is X-ray lithography.

4. A process as defined in claim 1 wherein the substrate carries a photoresist layer and the two light wavelengths are chosen to not cause exposure of the photoresist layer.

* * * * *